(12) United States Patent
Wada

(10) Patent No.: US 11,178,750 B2
(45) Date of Patent: Nov. 16, 2021

(54) MULTILAYER SUBSTRATE, MULTILAYER SUBSTRATE ARRAY, AND TRANSMISSION/RECEPTION MODULE

(71) Applicant: FUJIKURA LTD., Tokyo (JP)

(72) Inventor: Hideyuki Wada, Sakura (JP)

(73) Assignee: FUJIKURA LTD., Tokyo (JP)

( * ) Notice: Subject to any disclaimer, the term of this patent is extended or adjusted under 35 U.S.C. 154(b) by 178 days.

(21) Appl. No.: 16/605,275

(22) PCT Filed: Apr. 4, 2018

(86) PCT No.: PCT/JP2018/014416
§ 371 (c)(1),
(2) Date: Oct. 15, 2019

(87) PCT Pub. No.: WO2018/193844
PCT Pub. Date: Oct. 25, 2018

(65) Prior Publication Data
US 2020/0128661 A1    Apr. 23, 2020

(30) Foreign Application Priority Data
Apr. 17, 2017   (JP) .............................. JP2017-081136

(51) Int. Cl.
*H05K 1/02*   (2006.01)
*H05K 1/11*   (2006.01)
(Continued)

(52) U.S. Cl.
CPC ............. *H05K 1/0237* (2013.01); *H01Q 1/38* (2013.01); *H01Q 23/00* (2013.01); *H05K 1/0218* (2013.01); *H05K 3/4626* (2013.01)

(58) Field of Classification Search
CPC ... H05K 1/02; H05K 1/11; H05K 1/18; H05K 1/0218; H05K 1/0237; H05K 3/00; H05K 3/4626
(Continued)

(56) References Cited

U.S. PATENT DOCUMENTS 6,617,946 B2 *   9/2003   Kennedy ........... H01L 23/49805
                                                         333/246
7,908,407 B1 *   3/2011   Sivertsen .............. G06F 13/387
                                                         710/11
(Continued)

FOREIGN PATENT DOCUMENTS

JP         S56-78300 U       6/1981
JP         2001-007628 A     1/2001
(Continued)

OTHER PUBLICATIONS

Notification of Transmittal of Translation of the International Preliminary Report on Patentability (Form PCT/IB/338) issued in counterpart International application No. PCT/JP2018/014416 dated Oct. 31, 2019 with Forms PCT/IB/373 and PCT/ISA/237. (13 pages).
(Continued)

*Primary Examiner* — Xiaoliang Chen
(74) *Attorney, Agent, or Firm* — Westerman, Hattori, Daniels & Adrian, LLP

(57) ABSTRACT

Realized is a multilayer substrate and a multilayer substrate array, each of which has a high degree of freedom in a production method. At least part of an outer periphery (51) of a multilayer substrate (100), which includes a wiring provided on an inner layer, is processed so as to have a wave shape.

9 Claims, 6 Drawing Sheets

(51) Int. Cl.
*H05K 1/18* (2006.01)
*H05K 3/00* (2006.01)
*H01Q 1/38* (2006.01)
*H01Q 23/00* (2006.01)
*H05K 3/46* (2006.01)

(58) Field of Classification Search
USPC ...... 361/760, 679.02, 679.31, 679.4, 679.46, 361/720, 761, 803; 428/192
See application file for complete search history.

(56) References Cited

U.S. PATENT DOCUMENTS

| | | | | |
|---|---|---|---|---|
| 8,248,806 | B1 * | 8/2012 | Mimberg | G06F 1/20 |
| | | | | 361/720 |
| 10,235,323 | B2 * | 3/2019 | Arnouse | G06F 11/1423 |
| 2006/0046770 | A1 * | 3/2006 | Zhu | H04M 1/0202 |
| | | | | 455/550.1 |
| 2006/0046787 | A1 * | 3/2006 | Zhu | H04M 1/0266 |
| | | | | 455/566 |
| 2006/0058058 | A1 * | 3/2006 | Zhu | H04M 1/0202 |
| | | | | 455/550.1 |
| 2007/0044145 | A1 * | 2/2007 | Kurian | G06F 3/0227 |
| | | | | 726/9 |
| 2008/0198545 | A1 * | 8/2008 | Ni | G06F 21/32 |
| | | | | 361/679.31 |
| 2008/0253085 | A1 * | 10/2008 | Softer | G06F 1/18 |
| | | | | 361/679.4 |
| 2009/0166058 | A1 | 7/2009 | Lai et al. | |
| 2010/0061072 | A1 * | 3/2010 | Imazato | H05K 1/0218 |
| | | | | 361/803 |
| 2012/0142397 | A1 | 6/2012 | Jordan et al. | |
| 2012/0224118 | A1 * | 9/2012 | Kanzaki | G02F 1/133711 |
| | | | | 349/58 |
| 2014/0044930 | A1 * | 2/2014 | Chin | G09G 3/32 |
| | | | | 428/192 |
| 2015/0084208 | A1 * | 3/2015 | Iida | H01L 23/66 |
| | | | | 257/774 |
| 2015/0223337 | A1 * | 8/2015 | Steinmacher-Burow | |
| | | | | H05K 1/181 |
| | | | | 361/679.31 |
| 2016/0302301 | A1 * | 10/2016 | Kim | H05K 1/0298 |
| 2017/0192928 | A1 * | 7/2017 | Arnouse | H05K 7/20709 |
| 2017/0195111 | A1 * | 7/2017 | Takahashi | H04L 7/0041 |

FOREIGN PATENT DOCUMENTS

| | | |
|---|---|---|
| JP | 2003-508945 A | 3/2003 |
| JP | 2008-263360 A | 10/2008 |
| WO | 01/01517 A1 | 1/2001 |
| WO | 2008/010445 A1 | 1/2008 |

OTHER PUBLICATIONS

International Search Report dated Jun. 26, 2018, issued in counterpart application No. PCT/JP2018/014416, with English translation. (4 pages).

* cited by examiner

MULTILAYER SUBSTRATE, MULTILAYER SUBSTRATE ARRAY, AND TRANSMISSION/RECEPTION MODULE

TECHNICAL FIELD

The present invention relates to a multilayer substrate including a wiring provided on an inner layer. The present invention further relates to a multilayer substrate array and a transmitter-receiver module each of which includes such a multilayer substrate.

BACKGROUND ART

Conventionally, as a transmitter-receiver module for use in millimeter-wave radio or microwave radio, one that includes a multilayer substrate including a wiring provided on an inner layer has been known. Such a transmitter-receiver module has been required to suppress, as much as possible, a level of noise which enters a multilayer substrate through an outer periphery of the multilayer substrate from outside of the multilayer substrate.

As one of techniques for suppressing a level of such noise, Patent Literature 1 discloses a technique of forming a ground pattern on an outer periphery of a multilayer substrate. Specifically, Patent Literature 1 discloses a transmission line substrate (multilayer substrate) having a side-surface ground pattern which covers a side surface of a substrate.

CITATION LIST

Patent Literature

[Patent Literature 1]
Japanese Patent Application Publication, Tokukai No. 2008-263360 (published on Oct. 30, 2008)

SUMMARY OF INVENTION

Technical Problem

According to the transmission line substrate disclosed in Patent Literature 1, the side-surface ground pattern is formed by plating, with metal (for example, copper), the substrate having a laminated structure.

However, a step of plating, with metal, the substrate having the laminated structure needs to be carried out before an electronic component or an integrated circuit (IC) is mounted on the substrate. Therefore, according to the technique disclosed in Patent Literature 1, there is a limitation on order of steps for producing the transmission line substrate. In other words, the transmission line substrate disclosed in Patent Literature 1 has a problem that the transmission line substrate has a low degree of freedom in a method of producing the transmission line substrate.

An object of an aspect of the present invention is to realize a multilayer substrate and a multilayer substrate array, each of which has a high degree of freedom in a production method.

Solution to Problem

In order to attain the above object, a multilayer substrate in accordance with an aspect of the present invention is a multilayer substrate including a wiring provided on an inner layer, the multilayer substrate having an outer periphery at least part of which is processed so as to have a wave shape.

Advantageous Effects of Invention

According to an aspect of the present invention, it is possible to realize a multilayer substrate and a multilayer substrate array, each of which has a high degree of freedom in a production method.

Figure 2:
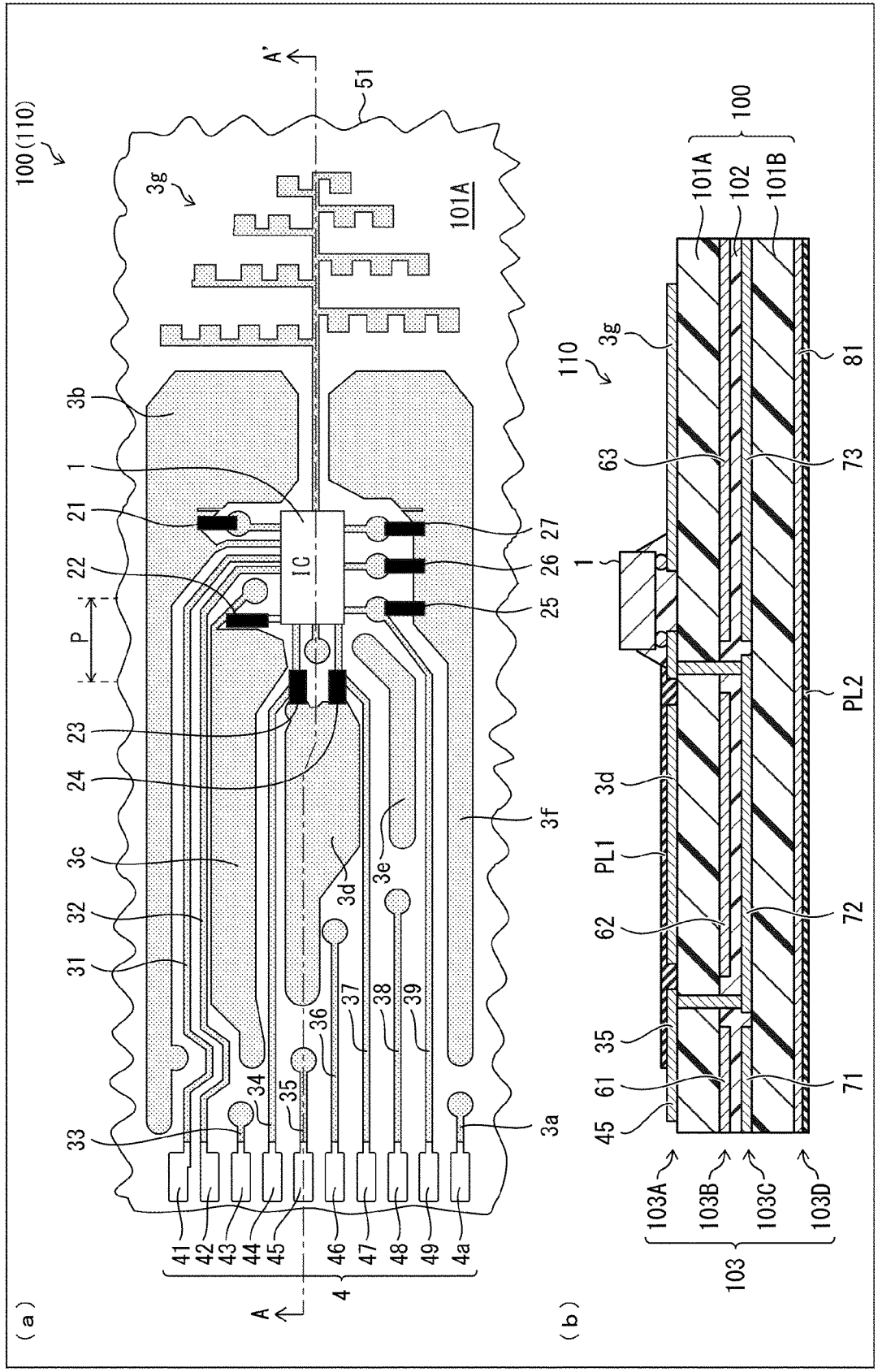

(a) of FIG. 2 is a plan view illustrating a configuration of a transmitter-receiver module including a multilayer substrate in accordance with Embodiment 1 of the present invention. (b) of FIG. 2 is a cross-sectional view illustrating the configuration of the transmitter-receiver module illustrated in (a) of FIG. 2.

Figure 3:
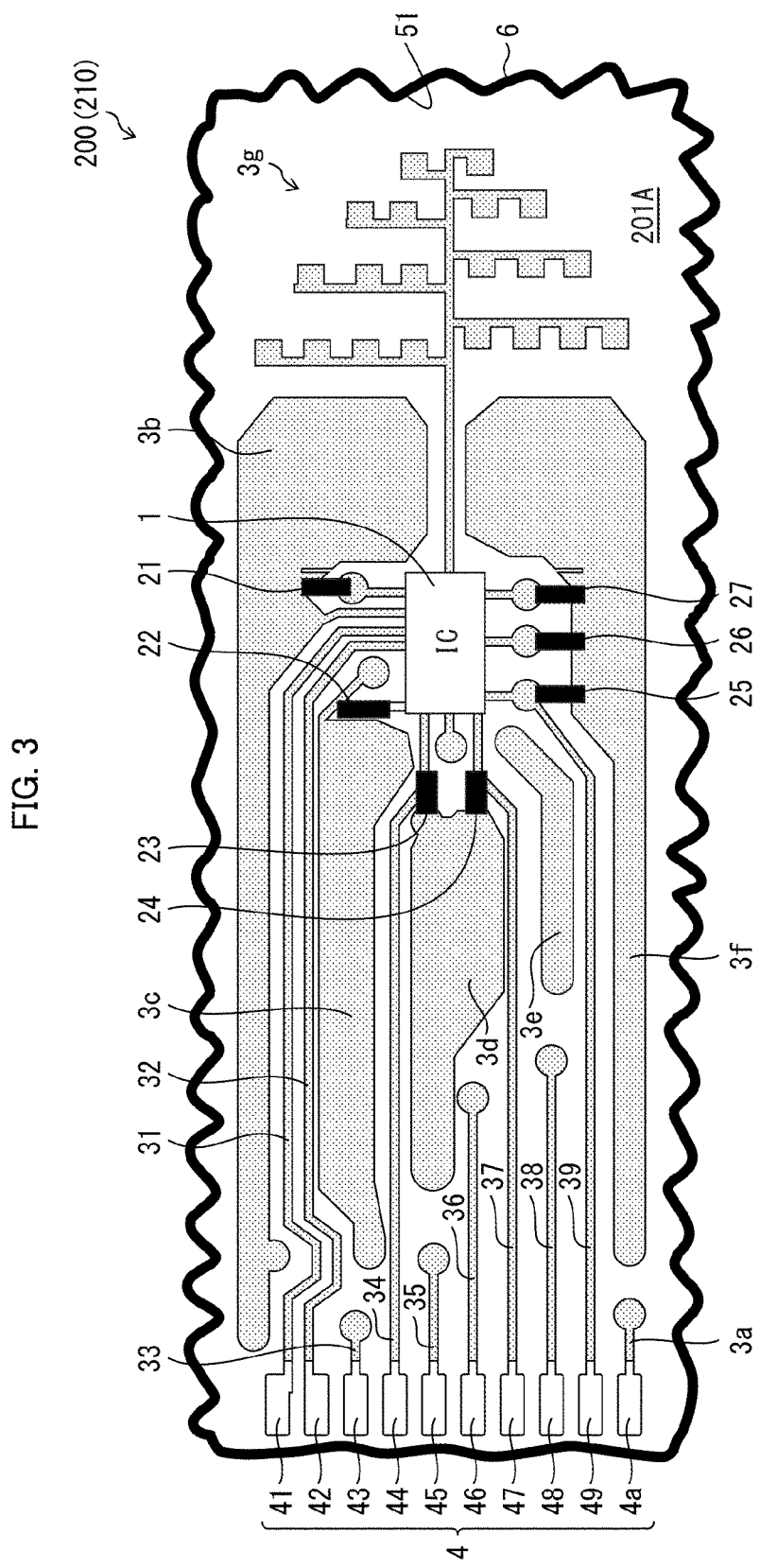

FIG. 3 is a plan view illustrating a configuration of a transmitter-receiver module including a multilayer substrate in accordance with Embodiment 2 of the present invention.

Figure 4:
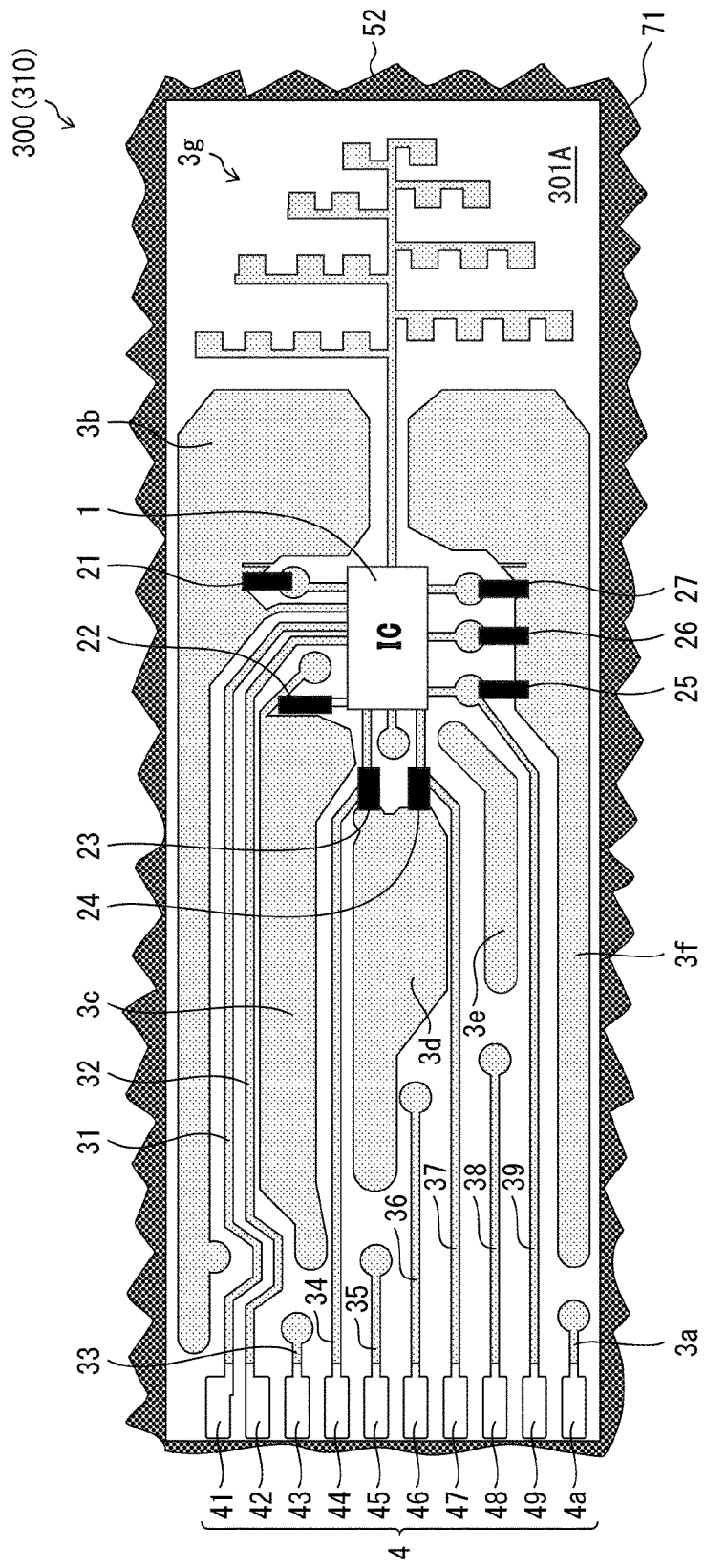

FIG. 4 is a plan view illustrating a configuration of a transmitter-receiver module including a multilayer substrate in accordance with Embodiment 3 of the present invention.

Figure 5:
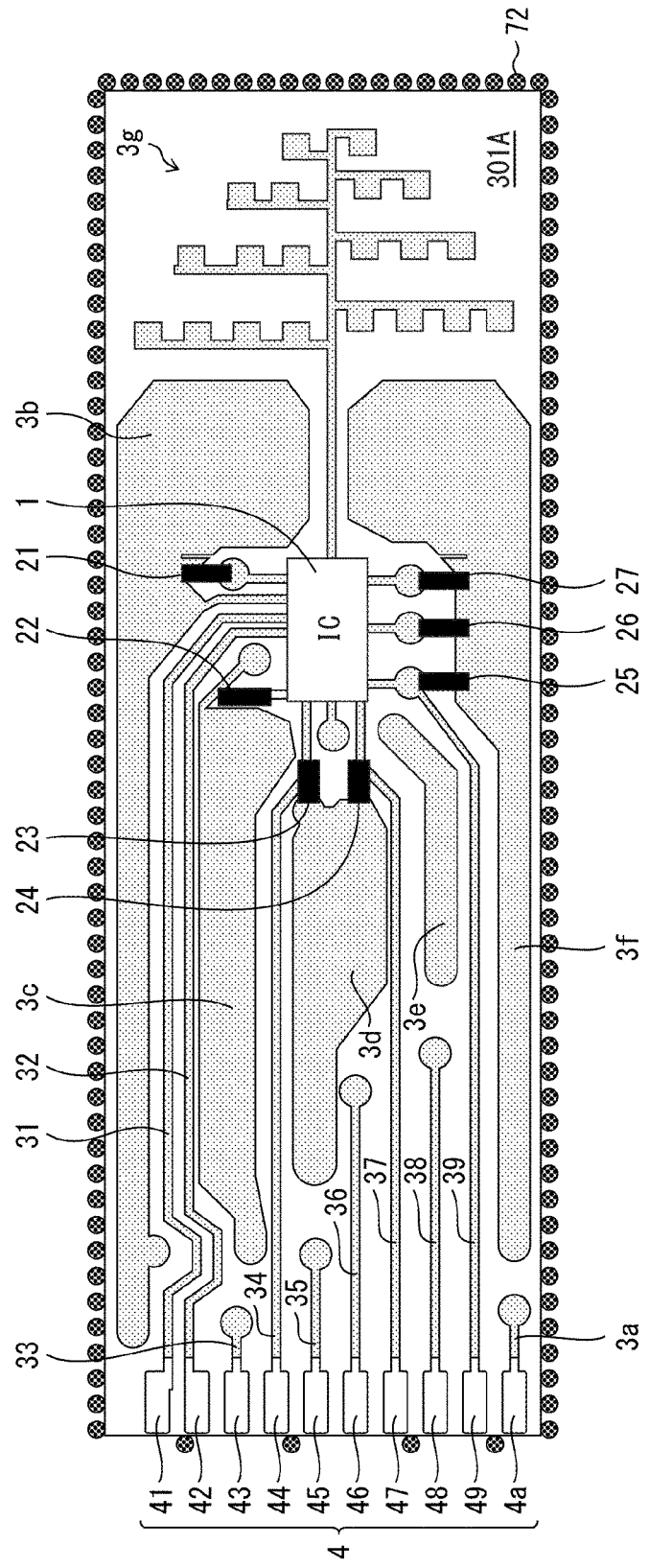

FIG. 5 is a plan view illustrating a configuration of the multilayer substrate seen in one of steps for producing the multilayer substrate illustrated in FIG. 4.

Figure 6:
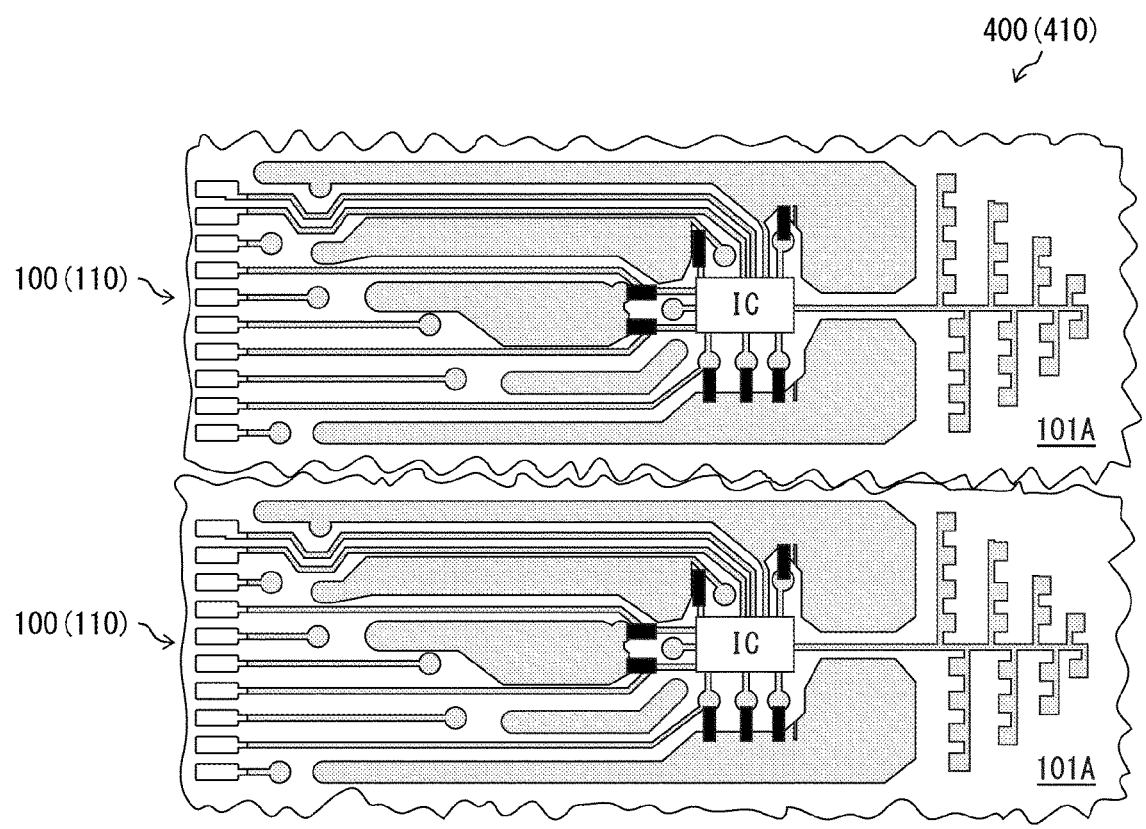

FIG. 6 is a plan view illustrating a configuration of a transmitter-receiver module array, including a multilayer substrate array, in accordance with Embodiment 4 of the present invention.

DESCRIPTION OF EMBODIMENTS (Cross Section of Transmitter-Receiver Module Including Multilayer Substrate)

Figure 1:
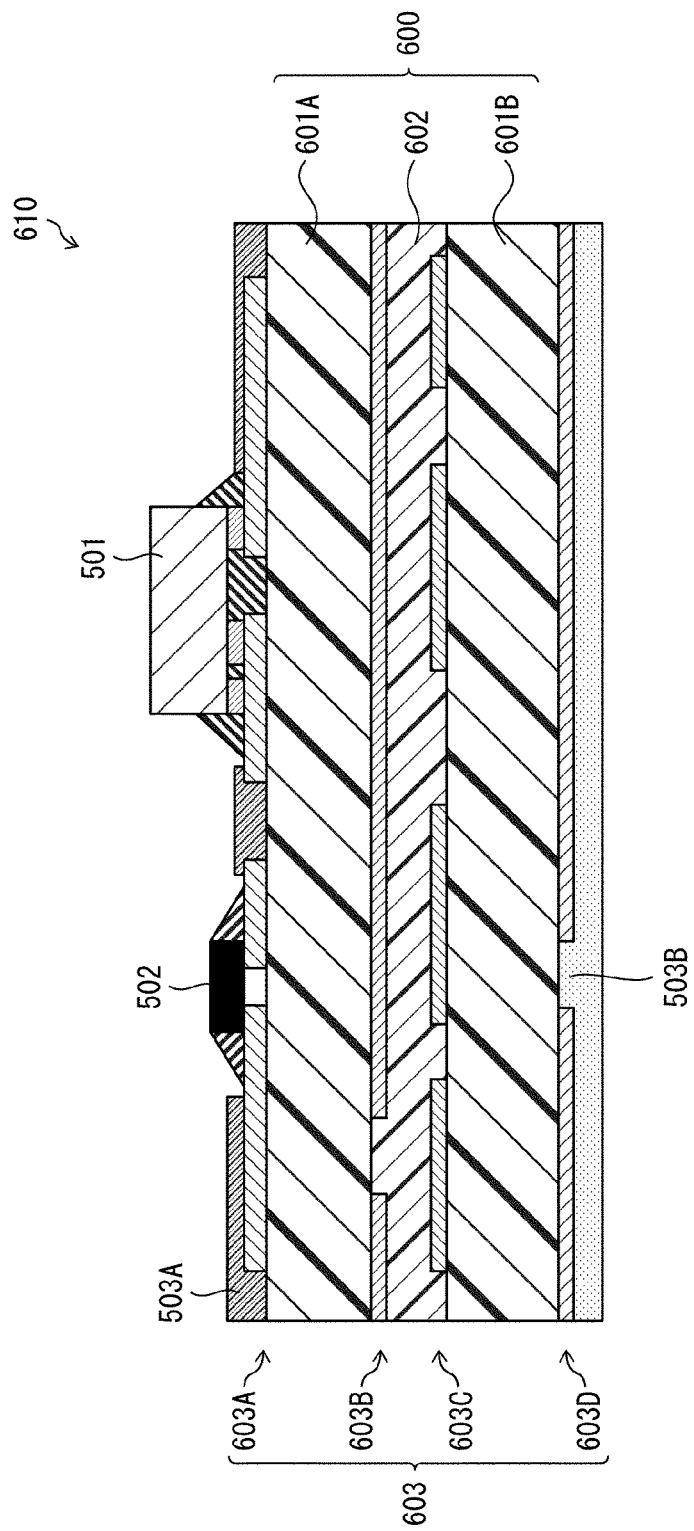
FIG. 1 is a cross-sectional view illustrating an example of a configuration of a transmitter-receiver module including a multilayer substrate in accordance with an aspect of the present invention.

Before a transmitter-receiver module including a multilayer substrate in accordance with an aspect of the present invention is described, an example of a cross-sectional structure of a transmitter-receiver module including a multilayer substrate will be described with reference to FIG. 1. FIG. 1 is a cross-sectional view illustrating an example of a configuration of a transmitter-receiver module 610 including a multilayer substrate 600.

The transmitter-receiver module 610 is for use in millimeter-wave radio or microwave radio, and includes a multilayer substrate 600, an IC 501, an electronic component 502, and passivation films 503A and 503B. The multilayer substrate 600 includes base materials 601A and 601B, a base material adhesive layer 602, and a wiring layer group 603. Note, here, that, for convenience, a side of the multilayer substrate 600 on which side the IC 501 and the electronic component 502 are provided is regarded as an upper side, and a side of the multilayer substrate 600 which side is opposite to the side on which the IC 501 and the electronic component 502 are provided is regarded as a lower side, according to an up-and-down direction of FIG. 1.

The base material 601A is caused to adhere to the base material 601B via the base material adhesive layer 602. A thing obtained by stacking up the base materials 601A and 601B and the base material adhesive layer 602 by such adhesion corresponds to a substrate having a laminated structure. Examples of a material of each of the base materials 601A and 601B include ceramic, silicon, polyethylene terephthalate (PET), glass epoxy, and polyimide. In other words, the multilayer substrate 600 can be a rigid substrate or can be alternatively a flexible substrate.

The IC 501 is provided as a functional element, and mainly controls transmission and reception of a radio wave by an antenna (later described). The IC 501 is an IC which is also called a baseband IC or a radio frequency (RF) IC (transceiver).

According to the present embodiment, the wiring layer group 603 is constituted by wiring layers 603A through 603D. The wiring layer 603A is provided on an upper surface of the base material 601A. The wiring layer 603B is provided on a lower surface of the base material 601A. The wiring layer 603C is provided on an upper surface of the base material 601B. The wiring layer 603D is provided on a lower surface of the base material 601B. Therefore, each of the wiring layers 603A and 603D forms a wiring layer provided on an outer side of the multilayer substrate 600, that is, an outer wiring layer, and each of the wiring layers 603B and 603C forms a wiring provided on an inner side of the multilayer substrate 600, that is, an inner wiring. The wiring layers 603B and 603C, each of which forms the inner wiring, is an example of the wiring (wiring provided on an inner layer) recited in the scope of the claims. What shape and how large in area the wiring layer group 603 should be to be provided on each of surfaces of the substrates 601A and 601B can be set, as appropriate, depending on routing of the wiring layer group 603. Note that no wiring layer group 603 can be provided on at least one of those surfaces. However, it is necessary that the wiring layer group 603 be provided on at least an inner layer of the multilayer substrate 600, for example, on the lower surface of the base material 601A or the upper surface of the base material 601B. In other words, the multilayer substrate 600 includes, as the wiring layer group 603, at least an inner wiring layer which is made up of the wiring layers 603B and 603C.

The wiring layer group 603 is roughly classified into at least a ground, a signal line, a power-supply line, and an antenna, depending on functions of the wiring layer group 603. The ground is a thing on which the electronic component 502 is grounded. The signal line is connected to the IC 501 and/or the electronic component 502, and various signals are transmitted therethrough. The power-supply line is connected to the IC 501, and is a path along which a power-supply voltage is supplied to the IC 501. The antenna transmits and receives a radio wave to/from an apparatus outside the transmitter-receiver module 610, under control of the IC 501.

The electronic component 502 is an electronic component for constituting an electronic circuit mounted on the transmitter-receiver module 610. Examples of the electronic component 502 include a capacitor, a resistor, a coil, and an oscillator.

The passivation film 503A is a protective film for protecting the upper surface of the base material 601A. The passivation film 503B is a protective film for protecting the lower surface of the base material 601B. The passivation film 503A is not provided around the IC 501 so that the passivation film 503A does not interfere with electric connection between the IC 501 and the wiring layer group 603. Similarly, the passivation film 503A is also not provided around the electronic component 502 so that the passivation film 503A does not interfere with electric connection between the electronic component 502 and the wiring layer group 603.

Embodiment 1

A transmitter-receiver module 110 including a multilayer substrate 100 in accordance with Embodiment 1 of the present invention will be described with reference to FIG. 2. (a) of FIG. 2 is a plan view illustrating a configuration of the transmitter-receiver module 110. (b) of FIG. 2 is a cross-sectional view illustrating the configuration of the transmitter-receiver module 110. (b) of FIG. 2 illustrates a cross section of the transmitter-receiver module 110 which cross section extends along a straight line AA' illustrated in (a) of FIG. 2.

The transmitter-receiver module 110 includes the multilayer substrate 100, an IC 1, electronic components 21 through 27, and passivation films PL1 and PL2, as illustrated in (a) and (b) of FIG. 2. Note that, for simplification of the drawing, (a) of FIG. 2 does not illustrate the passivation films included in the transmitter-receiver module 110.

The multilayer substrate 100 includes a base material 101A, a base material 101B, a base material adhesive layer 102, and a wiring layer group 103. The wiring layer group 103 is constituted by wiring layers 103A through 103D. The base material 101A, the base material 101B, the base material adhesive layer 102, and the wiring layer group 103 correspond to the base material 601A, the base material 601B, the base material adhesive layer 602, and the wiring layer group 603, respectively, of the multilayer substrate 600 illustrated in FIG. 1. Therefore, a configuration of the multilayer substrate 100, which corresponds to the multilayer substrate 600, will not be described here.

The wiring layer 103A provided on an upper surface of the base material 101A is constituted by wirings 31 through 39 and 3g and a connector 4. The connector 4 is constituted by terminals 41 through 49 and 4a. Note that, in the following description, the wirings 31 through 39 and 3a will be also referred to as wirings 31 through 3a, and the terminals 41 through 49 and 4a will be also referred to as terminals 41 through 4a.

As has been described, the wiring layer 103A corresponds to the wiring layer 603A (see FIG. 1) of the multilayer substrate 600 illustrated in FIG. 1. The wiring layer 103B includes wirings 61 through 63 illustrated in (b) of FIG. 2. The wiring layer 103B corresponds to the wiring layer 603B of the multilayer substrate 600. The wiring layer 103C includes wirings 71 through 73 illustrated in (b) of FIG. 2. The wiring layer 103C corresponds to the wiring layer 603C of the multilayer substrate 600. The wiring layer 103D is constituted by a wiring 81 illustrated in (b) of FIG. 2. The wiring layer 103D corresponds to the wiring layer 603D of the multilayer substrate 600.

The IC 1 corresponds to the IC 501 (see FIG. 1) included in the transmitter-receiver module 610 illustrated in FIG. 1. The electronic components 21 through 27 correspond to the electronic component 502 (see FIG. 1) included in the transmitter-receiver module 610 illustrated in FIG. 1. The passivation films PL1 and PL2 provided on respective surfaces of the transmitter-receiver module 110 correspond to the passivation films 503A and 503B, respectively, included in the transmitter-receiver module 610 illustrated in FIG. 1.

The terminals 41 through 49 and 4a of the connector 4 are connected to the wirings 31 through 39 and 3a, respectively. The wirings 31 through 3a include (i) a signal line(s) via each of which a corresponding one of the terminals 41 through 4a of the connector 4 is connected to the IC 1, (ii) a power-supply line(s) for the IC 1, (iii) a ground line(s) or a ground pattern(s) each of which is connected to a corresponding one of wirings 3*b* through 3*f*, and (iv) a clock line(s) through which an operation clock is supplied to the IC 1. In the following description, the ground lines and the ground patterns will be also merely collectively referred to as a ground. The wirings 3*b* through 3*f* each function as a ground. The wiring 3*g* functions as an antenna. In FIG. 2, the wirings 31 and 32 are each connected to the IC 1. The wirings 34, 37, and 39 are connected to the electronic components 23, 24, and 25, respectively, and are each connected to the IC 1. The electronic components 21 through 27 are connected to the wirings 3*b*, 3*c*, 3*d*, 3*d*, 3*f*, 3*f*, and 3*f*, respectively. The IC 1 is connected to the wiring 3*g*. A wiring via which the IC 1 is connected to the wiring 3*g* is a signal line through which (i) an outgoing wave is transmitted so as to be supplied from the IC 1 to the wiring 3*g* and (ii) an incoming wave is transmitted so as to be supplied from the wiring 3*g* to the IC 1. This signal line can be partially provided on an inner layer of the multilayer substrate, similarly to a wiring 72 (later described).

The wirings 61 through 63, the wirings 71 and 73, and the wiring 81 each function as a ground (see (b) of FIG. 2). The wiring 35 and the wiring 72 are each a signal line via which the terminal 45 is connected to the IC 1 (see (b) of FIG. 2). The wiring 35 is connected to the wiring 72 through a via. Similarly, the wiring 72 is connected to, through a via, an electrode pad to which a terminal of the IC 1 is connected. Thus, the wiring 72 is an example of a signal line provided on the inner layer of the multilayer substrate 100.

(Effects of Multilayer Substrate 100)

Here, at least part of an outer periphery 51 of the multilayer substrate 100 is processed so as to have a wave shape. In Embodiment 1, the outer periphery itself of the substrate having a laminated structure is processed so as to have the wave shape, as illustrated in FIG. 2. In Embodiment 1, the entire outer periphery 51 of the multilayer substrate 100 is processed so as to have the wave shape.

According to the multilayer substrate 100 in accordance with Embodiment 1, noise which passes through the outer periphery 51 of the multilayer substrate 100 from outside of the multilayer substrate 100 enters a wave-shaped region which is a region having a contour processed so as to have the wave shape. The noise which has entered the wave-shaped region is scattered and/or reflected by an interface between the wave-shaped region and atmospheric air. In this manner, a phase difference occurs in noise which enters the multilayer substrate through a varying part of the wave-shaped region, due to a fact that the noise enters the multilayer substrate along a varying path. Therefore, in a macro perspective, as compared with a multilayer substrate to which a wave-shaped region is not provided, the multilayer substrate 100 allows damping of an entire amount of noise which enters the wirings provided on the inner layer of the multilayer substrate (that is, the wiring layers 103B and 103C, each of which is an inner wiring), by causing interference in the noise. That is, in a macro perspective, it is possible to suppress a level of noise.

According to the multilayer substrate 100, it is possible to suppress the level of the noise without plating, with metal, a side surface of the substrate having the laminated structure. Furthermore, in producing the multilayer substrate 100, it is possible to carry out a step of forming the wave-shaped region by processing the substrate, after carrying out a step of mounting the electronic components 21 through 27 and/or the IC 1 on the substrate. As such, there is a loose limitation on order of steps for producing the multilayer substrate 100, as compared with a case where the side surface of the substrate is plated with metal. This allows the multilayer substrate 100 to have an increased degree of freedom in a production method.

Moreover, according to the multilayer substrate 100, since it is possible to suppress a level of noise which passes through the entire outer periphery 51, it is possible to bring about a greater noise level damping effect. Note, however, that an arrangement itself in which the entire outer periphery 51 is processed so as to have the wave shape is not essential for the multilayer substrate 100.

Note that the wave-shaped region provided on the outer periphery 51 does not need to have a function of completely blocking noise. The wave-shaped region provided on the outer periphery 51 is configured such that it is possible to suppress a level of the noise to a level at which the noise does not constitute an obstacle to reading of a signal in the transmitter-receiver module 110.

The wave shape of the outer periphery 51 can include at least one of a contour of a sine curve, a contour of a substantial rectangular, a contour of a "U" shape, and the like. Those contours can be provided successively or discretely or can be alternatively provided periodically or non-periodically.

Note, however, that, in a plan view, the wave shape of the outer periphery 51 of the multilayer substrate 100 is preferably constituted by a smooth curve. In other words, a function which represents the wave shape is preferably differentiable, and a derivative obtained by differentiation is preferably continuous.

According to the above configuration, it is possible to reduce an area of a flat part of the wave-shaped region provided on the outer periphery 51. This allows a reduction in proportion of noise in which a phase difference does not occur, among noise which enters the wave-shaped region. As a result, it is possible to increase damping of noise which enters the multilayer substrate, the damping being caused by interference in the noise. Therefore, according to the multilayer substrate 100, it is possible to further suppress a level of noise.

The multilayer substrate 100 is preferably configured such that at least part of the outer periphery 51 which part extends in a direction in which the wirings 61 through 63 and the wirings 71 through 73, each of which is an inner wiring, extend is processed so as to have the wave shape.

Particularly, the multilayer substrate 100 is preferably configured such that part of the outer periphery 51 which part extends along the wiring 72, which is a signal line, out of the wirings 61 through 63 and the wirings 71 through 73, each of which is an inner wiring, is processed so as to have the wave shape. That is, it is preferable that, since the signal line extends in a lengthwise direction of the multilayer substrate 100, the outer periphery 51 has, on both sides of the multilayer substrate 100 in a widthwise direction of the multilayer substrate 100, the wave shape which is formed in the lengthwise direction of the multilayer substrate 100.

In a case where noise which passes through part of the outer periphery 51 which part extends in a direction in which the wiring 72 extends (that is, longitudinal direction) is compared with noise which passes through part of the outer periphery 51 which part intersects the direction in which the wiring 72 extends, the noise which passes through the part of the outer periphery 51 which part extends in the direction in which the wiring 72 extends has a greater effect on a signal transmitted through the wiring 72. According to the above configuration, it is possible to effectively suppress a level of noise, as compared with a case where the part of the outer periphery 51 which part intersects the direction in which the wiring 72 extends (that is, part corresponding to a short side, in a case where a shape of the multilayer substrate 100 in a plan view is regarded as a substantial rectangular) is processed so as to have the wave shape.

A pitch P between adjacent waves of the wave shape can be set as appropriate depending on a frequency of the noise to be damped. As an example, in a case where noise having a frequency of 60 GHz is to be damped, the pitch P is preferably set to approximately 5 mm. As another example, in a case where noise having a frequency of 3 GHz is to be damped, the pitch P is preferably set to approximately 100 mm.

Embodiment 2

In the following description, for convenience, an identical reference sign will be given to a member having a function identical to that of a member described above, and description of such a member will be omitted.

A transmitter-receiver module 210 including a multilayer substrate 200 in accordance with Embodiment 2 of the present invention will be described with reference to FIG. 3. FIG. 3 is a plan view illustrating a configuration of the transmitter-receiver module 210.

The multilayer substrate 200 of the transmitter-receiver module 210 further includes a dielectric layer 6 in addition to the configuration of the multilayer substrate 100 (see FIG. 2) of the transmitter-receiver module 110.

The dielectric layer 6 is provided on an edge surface of the multilayer substrate 200, and covers an entire outer periphery 51 (see FIG. 3). Examples of a dielectric material of which the dielectric layer 6 is made include resin materials such as epoxy, polyimide, rubber, urethane, and polystyrol. The other examples of the dielectric material of which the dielectric layer 6 is made include mixtures obtained by mixing a carbon powder into each of such resin materials.

In a case where noise is reflected by the dielectric layer 6, a phase of the noise changes greatly. This makes it possible to promote interference between the noise and another electromagnetic wave and accordingly promote damping of the noise. It is therefore possible to bring about a greater noise level damping effect.

The dielectric layer 6 is preferably made of a resin which has flexibility in a state where the resin is cured. This causes the dielectric layer 6 not to easily come off in the multilayer substrate 200. This ultimately allows the multilayer substrate 200 not to easily break.

The multilayer substrate 200 can be produced by, for example, applying the dielectric material to the entire outer periphery 51 (by a fixed amount discharging method, a spray applying method, or the like).

Note that a resin for use in underfilling for a connector 4 can be used as a material of the dielectric layer 6, and underfilling for the connector 4 and formation of the dielectric layer 6 can be simultaneously carried out.

Embodiment 3

A transmitter-receiver module 310 including a multilayer substrate 300 in accordance with Embodiment 3 of the present invention will be described with reference to FIGS. 4 and 5. FIG. 4 is a plan view illustrating a configuration of the transmitter-receiver module 310. FIG. 5 is a plan view illustrating a configuration of the multilayer substrate 300 seen in one of steps for producing the multilayer substrate 300 illustrated in FIG. 4.

The configuration of the multilayer substrate 300 of the transmitter-receiver module 310 is different from that of the multilayer substrate 100 (see FIG. 2) of the transmitter-receiver module 110 in the following points.

At least part of an outer periphery 52 (entire outer periphery 52 in Embodiment 3) of the multilayer substrate 300 is processed so as to have a wave shape. Note, however, that, in FIG. 4, the multilayer substrate 300 having a laminated structure has a rectangular shape in a plan view, and the outer periphery itself of the multilayer substrate 300 is not processed so as to have the wave shape. The outer periphery of the substrate is covered with a dielectric layer 71, and an outer periphery of the dielectric layer 71 is processed so as to have the wave shape. Examples of a dielectric material of which the dielectric layer 71 is made include materials identical to the dielectric materials of each of which the dielectric layer 6 (see FIG. 3) can be made.

The multilayer substrate 300 can be produced by, for example, the following method. First, as illustrated in FIG. 5, a plurality of dielectric materials 72 are applied to the outer periphery of the multilayer substrate 300. Note that the plurality of dielectric materials 72 can be applied by, for example, a fixed amount discharging method. After the plurality of dielectric materials 72 are spread out, the plurality of dielectric materials 72 are cured. By the plurality of dielectric materials 72 curing while spreading out in wet condition on the outer periphery of the multilayer substrate 300, the dielectric layer 71, which forms the outer periphery 52 and which has the wave shape, is obtained.

According to the multilayer substrate 300 of the transmitter-receiver module 310, it is also possible to achieve effects similar to those achieved by the multilayer substrate 200 (see FIG. 3) of the transmitter-receiver module 210.

Note that a resin for use in underfilling for a connector 4 can be used as the plurality of dielectric materials 72, and underfilling for the connector 4 and formation of the dielectric layer 71 can be simultaneously carried out.

Embodiment 4

A transmitter-receiver module array 410, including a multilayer substrate array 400, in accordance with Embodiment 4 of the present invention will be described with reference to FIG. 6. FIG. 6 is a plan view illustrating a configuration of the transmitter-receiver module array 410.

The transmitter-receiver module array 410 is obtained by arranging a plurality of transmitter-receiver modules 110 on one plane. In other words, the multilayer substrate array 400 is obtained by arranging a plurality of multilayer substrates 100 on one plane. Therefore, according to the multilayer substrate array 400, it is possible to achieve effects similar to those achieved by the multilayer substrate 100.

Note that the multilayer substrate array 400 (transmitter-receiver module array 410) can be alternatively constituted by a plurality of multilayer substrates 200 (plurality of transmitter-receiver modules 210) or a plurality of multilayer substrates 300 (plurality of transmitter-receiver modules 310), instead of the plurality of multilayer substrates 100 (plurality of transmitter-receiver modules 110).

(Recap)

A multilayer substrate (100, 200, 300) in accordance with an aspect of the present invention is a multilayer substrate (100, 200, 300) including a wiring (61 through 63 and 71 through 73) provided on an inner layer, the multilayer substrate (100, 200, 300) having an outer periphery (51, 52) at least part of which is processed so as to have a wave shape.

According to the above configuration, part of noise which passes through the outer periphery of the multilayer substrate from outside of the multilayer substrate enters a part which is processed so as to have the wave shape (hereinafter, also referred to as a wave-shaped region). Noise which has entered the wave-shaped region is scattered and/or reflected by an interface between the wave-shaped region and atmospheric air. In this manner, a phase difference occurs in noise which enters the multilayer substrate through a varying part of the wave-shaped region, due to a fact that the noise enters the multilayer substrate along a varying path. Therefore, in a macro perspective, as compared with a multilayer substrate to which a wave-shaped region is not provided, the multilayer substrate in accordance with an aspect of the present invention allows damping of an entire amount of noise which enters the multilayer substrate, by causing interference in the noise. That is, in a macro perspective, it is possible to suppress a level of noise.

According to the multilayer substrate in accordance with an aspect of the present invention, it is possible to suppress the level of the noise without plating, with metal, a side surface of a substrate having a laminated structure. Furthermore, in producing the multilayer substrate in accordance with an aspect of the present invention, it is possible to carry out a step of forming the wave-shaped region by processing the substrate, after carrying out a step of mounting an electronic component and/or an IC on the substrate. As such, there is a loose limitation on order of steps for producing the multilayer substrate in accordance with an aspect of the present invention, as compared with a case where the side surface of the substrate is plated with metal. This allows the multilayer substrate in accordance with an aspect of the present invention to have an increased degree of freedom in a production method.

The multilayer substrate (100, 200, 300) in accordance with an aspect of the present invention is preferably arranged such that, in a plan view, the wave shape is constituted by a smooth curve.

According to the above configuration, it is possible to reduce an area of a flat part of the wave-shaped region. This allows a reduction in proportion of noise in which a phase difference does not occur, among noise which enters the wave-shaped region. As a result, it is possible to increase damping of noise which enters the multilayer substrate, the damping being caused by interference in the noise. Therefore, according to the multilayer substrate in accordance with an aspect of the present invention, it is possible to further suppress a level of noise.

Further, the multilayer substrate (100, 200, 300) in accordance with an aspect of the present invention is preferably arranged such that part of the outer periphery (51, 52) which part extends in a direction in which the wiring (61 through 63 and 71 through 73) extends is processed so as to have the wave shape.

In a case where noise which passes through part of the outer periphery of the multilayer substrate, which part extends in a direction in which the wiring extends, is compared with noise which passes through part of the outer periphery which part intersects the direction in which the wiring extends, the noise which passes through the part of the outer periphery which part extends in the direction in which the wiring extends has a greater effect on a signal transmitted through the wiring. According to the above configuration, it is possible to effectively suppress a level of noise, as compared with a case where the part of the outer periphery which part intersects the direction in which the wiring extends is processed so as to have the wave shape.

The multilayer substrate (100, 200, 300) in accordance with an aspect of the present invention is preferably arranged so as to further include: a connector (4); and an IC (1), the wiring being part (72) of a signal line via which the connector (4) is connected to the IC (1).

According to the above configuration, it is possible to suppress a level of noise which can directly affect the signal line through which a signal is transmitted between the connector and the IC. Therefore, according to the multilayer substrate in accordance with an aspect of the present invention, it is possible to more effectively suppress a level of noise.

Further, the multilayer substrate (100, 200, 300) in accordance with an aspect of the present invention is preferably arranged such that the entire outer periphery (51, 52) is processed so as to have the wave shape.

According to the above configuration, since the wave-shaped region is provided on the entire outer periphery of the multilayer substrate, it is possible to more absolutely suppress a level of noise.

Further, the multilayer substrate (200, 300) in accordance with an aspect of the present invention is preferably arranged such that part of the multilayer substrate (200, 300) which part is processed so as to have the wave shape is constituted by a dielectric layer (6, 71).

A greater phase difference tends to occur in noise which is scattered and/or reflected by an interface between the multilayer substrate and the dielectric layer. Therefore, in a case where interference occurs in noise that has a greater phase difference, it is possible to more greatly suppress the noise in a macro perspective, as compared with a case where interference occurs in noise that has a smaller phase difference. Therefore, according to the multilayer substrate in accordance with an aspect of the present invention, it is possible to more effectively suppress a level of noise, as compared with a case where the multilayer substrate does not include the wave-shaped region constituted by the dielectric layer.

The multilayer substrate (200, 300) in accordance with an aspect of the present invention is preferably arranged such that the dielectric layer (6, 71) is made of a resin which has flexibility in a state where the resin is cured.

According to the above configuration, even in a case where any external force (for example, vibration) acts on the multilayer substrate, the dielectric layer does not easily come off in the multilayer substrate. In a case where the dielectric layer comes off in the multilayer substrate, a phase difference is difficult to occur in noise which passes through part of the multilayer substrate in which part the dielectric layer comes off. Therefore, an effect of suppressing a level of noise is decreased. According to the multilayer substrate in accordance with an aspect of the present invention, it is possible to cause the dielectric layer not to easily come off. Therefore, according to the multilayer substrate in accordance with an aspect of the present invention, it is possible to suppress a level of noise for a long term even in an environment in which any external force can act.

A multilayer substrate array (400) in accordance with an aspect of the present invention is a multilayer substrate array (400) including a plurality of multilayer substrates (100, 200, 300) in accordance with an aspect of the present invention, the plurality of multilayer substrates (100, 200, 300) being arranged on one plane.

A transmitter-receiver module in accordance with an aspect of the present invention is a transmitter-receiver module including: the multilayer substrate in accordance with an aspect of the present invention; an IC; and an antenna connected to the IC, the wiring being part of a signal line via which the antenna is connected to the IC.

The multilayer substrate array and the transmitter-receiver module configured as described above are also encompassed in the scope of the present invention. According to the multilayer substrate array and the transmitter-receiver module, it is possible to achieve effects similar to those achieved by the multilayer substrate in accordance with an aspect of the present invention.

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST 100, 200, 300, 600 Multilayer substrate
103, 603 Wiring layer group
103A through 103D, 603A through 603D Wiring layer
72, 31 through 3g Wiring
4 Connector
51, 52 Outer periphery of multilayer substrate
6, 71 Dielectric layer
400 Multilayer substrate array
110, 210, 310, 410, 610 Transmitter-receiver module

The invention claimed is:

1. A multilayer substrate comprising
a wiring provided on an inner layer,
the multilayer substrate having an outer periphery at least part of which is processed so as to have a wave shape,
wherein part of the outer periphery which part extends in a direction in which the wiring extends is processed so as to have the wave shape.

2. The multilayer substrate as set forth in claim 1, wherein, in a plan view, the wave shape is constituted by a smooth curve.

3. The multilayer substrate as set forth in claim 1, further comprising:
a connector; and
an IC,
the wiring being part of a signal line via which the connector is connected to the IC.

4. The multilayer substrate as set forth in claim 1, wherein the entire outer periphery is processed so as to have the wave shape.

5. The multilayer substrate as set forth in claim 1, wherein part of the multilayer substrate which part is processed so as to have the wave shape is constituted by a dielectric layer.

6. The multilayer substrate as set forth in claim 5, wherein the dielectric layer is made of a resin which has flexibility in a state where the resin is cured.

7. A multilayer substrate array comprising
a plurality of multilayer substrates recited in claim 1,
the plurality of multilayer substrates being arranged on one plane.

8. A transmitter-receiver module comprising:
the multilayer substrate recited in claim 1;
an IC; and
an antenna connected to the IC,
the wiring being part of a signal line via which the antenna is connected to the IC.

9. The multilayer substrate as set forth in claim 1, wherein the wave shape is provided non-periodically.

* * * * *